(12) United States Patent
Endoh et al.

(10) Patent No.: US 10,903,185 B2
(45) Date of Patent: Jan. 26, 2021

(54) BONDING MATERIAL AND BONDING METHOD USING SAME

(71) Applicant: Dowa Electronics Materials Co., Ltd., Tokyo (JP)

(72) Inventors: Keiichi Endoh, Okayama (JP); Koichi Yuzaki, Osaka (JP); Minami Nagaoka, Okayama (JP); Hiromasa Miyoshi, Okayama (JP); Satoru Kurita, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 311 days.

(21) Appl. No.: 15/307,123

(22) PCT Filed: May 15, 2015

(86) PCT No.: PCT/JP2015/064665
§ 371 (c)(1),
(2) Date: Oct. 27, 2016

(87) PCT Pub. No.: WO2015/182489
PCT Pub. Date: Dec. 3, 2015

(65) Prior Publication Data
US 2017/0077057 A1    Mar. 16, 2017

(30) Foreign Application Priority Data

May 30, 2014    (JP) ................. 2014-112212

(51) Int. Cl.
| | | |
|---|---|---|
| B23K 35/00 | (2006.01) | |
| H01L 23/00 | (2006.01) | |
| B22F 1/02 | (2006.01) | |
| H01B 1/00 | (2006.01) | |
| H01B 13/00 | (2006.01) | |
| B22F 1/00 | (2006.01) | |
| B23K 20/00 | (2006.01) | |
| B22F 9/00 | (2006.01) | |
| H01B 1/22 | (2006.01) | |
| B23K 1/00 | (2006.01) | |
| B23K 35/02 | (2006.01) | |
| B23K 35/30 | (2006.01) | |
| B23K 35/36 | (2006.01) | |

(52) U.S. Cl.
CPC ............ *H01L 24/29* (2013.01); *B22F 1/00* (2013.01); *B22F 1/0044* (2013.01); *B22F 1/02* (2013.01); *B22F 9/00* (2013.01); *B23K 1/0016* (2013.01); *B23K 20/00* (2013.01); *B23K 35/025* (2013.01); *B23K 35/3006* (2013.01); *B23K 35/3613* (2013.01); *B23K 35/3618* (2013.01); *H01B 1/00* (2013.01); *H01B 1/22* (2013.01); *H01B 13/00* (2013.01); *H01L 24/83* (2013.01); *B22F 2301/255* (2013.01); *B22F 2302/45* (2013.01); *B22F 2304/054* (2013.01); *B22F 2998/10* (2013.01); *H01L 24/32* (2013.01); *H01L 2224/2939* (2013.01); *H01L 2224/2949* (2013.01); *H01L 2224/29139* (2013.01); *H01L 2224/29339* (2013.01); *H01L 2224/32245* (2013.01); *H01L 2224/8309* (2013.01); *H01L 2224/83075* (2013.01); *H01L 2224/8384* (2013.01); *H01L 2224/83204* (2013.01); *H01L 2924/01047* (2013.01)

(58) Field of Classification Search
None
See application file for complete search history.

(56) References Cited

U.S. PATENT DOCUMENTS

| | | | |
|---|---|---|---|
| 2007/0269923 A1* | 11/2007 | Lee ..................... | H01G 9/2031 |
| | | | 438/85 |
| 2015/0028085 A1* | 1/2015 | Endoh .................. | B22F 1/0018 |
| | | | 228/224 |

FOREIGN PATENT DOCUMENTS

| | | |
|---|---|---|
| EP | 2645408 A1 | 10/2013 |
| EP | 2719486 A1 | 4/2014 |
| JP | 2011080147 | 4/2011 |
| JP | 2011240406 | 12/2011 |
| JP | 2014235942 | 12/2014 |
| JP | 2015004105 | 1/2015 |
| WO | 2009/116136 | 9/2009 |
| WO | 2011/155055 | 12/2011 |
| WO | 2012070262 | 5/2012 |
| WO | 2012/169076 | 12/2012 |
| WO | 2013/108408 | 7/2013 |

OTHER PUBLICATIONS

Supplementary European search report for patent application No. 15799050.8 dated Dec. 1, 2017.

* cited by examiner

*Primary Examiner* — Erin B Saad
(74) *Attorney, Agent, or Firm* — Bachman & LaPointe, PC

(57) ABSTRACT

A bonding material includes: fine silver particles having an average primary particle diameter of 1 to 50 nm, each of the fine silver particles being coated with an organic compound having a carbon number of not greater than 8, such as hexanoic acid; silver particles having an average primary particle diameter of 0.5 to 4 µm each of the silver particles being coated with an organic compound, such as oleic acid; a solvent containing a primary alcohol solvent and a terpene alcohol solvent; and a dispersant containing a phosphoric acid ester dispersant (or a phosphoric acid ester dispersant and an acrylic resin dispersant), wherein the content of the fine silver particles is in the range of from 5 wt % to 30 wt %, and the content of the silver particles is in the range of from 60 wt % to 90 wt %, the total content of the fine silver particles and the silver particles being not less than 90 wt %, and wherein the bonding material further includes a sintering aid of a monocarboxylic acid having an ether bond.

13 Claims, No Drawings

BONDING MATERIAL AND BONDING METHOD USING SAME

TECHNICAL FIELD

The present invention relates generally to a bonding material and a bonding method using the same. More specifically, the invention relates to a bonding material of a silver paste containing fine silver particles, and a method for bonding articles to each other using the same.

BACKGROUND ART

In recent years, it is proposed that a silver paste containing fine silver particles is used as a bonding material to be arranged between articles to be heated for a predetermined period of time while applying pressure between the articles, to sinter silver in the bonding material to bond the articles to each other (see, e.g., Japanese Patent Laid-Open No. 2011-80147).

In order to bond articles to each other by substituting such a bonding material for a lead solder, it is desired that the articles can be bonded (pressureless-bonded) to each other without applying pressure between the articles, as such a case in which the articles are bonded to each other by a lead solder. Also in order to prevent silver oxide from being formed in the bonded portion between the articles to prevent the bonding strength between the articles from being deteriorated, it is desired that the articles can be bonded to each other even in an inert atmosphere, such as a nitrogen atmosphere.

As a bonding material capable of bonding articles to each other in an inert atmosphere even if any pressure is applied between the articles, there is proposed a bonding material wherein a flux component, such as diglycolic acid, is added to a silver paste containing fine silver particles (see, e.g., Japanese Patent Laid-Open No. 2011-240406).

Moreover, in order to satisfactorily apply the bonding material by the screen printing using a metal mask, it is required to decrease the viscosity of the bonding material. However, the content of silver in the bonding material is decreased if the viscosity of the bonding material is decreased, and the viscosity of the bonding material is increased if the content of silver in the bonding material is increased, so that the relationship between the viscosity of the bonding material and the content of silver in the bonding material is trade-off.

In general, in order to decrease the viscosity of a bonding material of a silver paste containing fine silver particles, it is known to add a dispersant to the bonding material. As a bonding material which has a high content of silver (a small amount of a solvent to be added) and the viscosity of which can be decreased to a viscosity suitable for printing, there is proposed a bonding material wherein a phosphoric acid dispersant, such as a phosphate ester dispersant, is added to a silver paste containing fine silver particles (see, e.g., Japanese Patent Laid-Open No. 2013-4309).

However, if articles are bonded to each other by means of the bonding material wherein the flux component, such as diglycolic acid, is added to the silver paste as proposed in Japanese Patent Laid-Open No. 2011-240406 or by means of the bonding material wherein the phosphoric acid dispersant, such as the phosphate ester dispersant, is added to the silver paste as proposed in Japanese Patent Laid-Open No. 2013-4309, there is a case in which it is not possible to satisfactorily bond the articles to each other due to unsintered portions produced in the bonded portion (the silver bonding layer).

DISCLOSURE OF THE INVENTION

It is therefore an object of the present invention to eliminate the aforementioned problems and to provide a bonding material, which can be easily printed on an article to be bonded and which can restrain unsintered portions from being produced in a bonded portion in which the article is bonded to another article, and a bonding method using the same.

In order to accomplish the aforementioned and other objects, the inventors have diligently studied and found that it is possible to provide a bonding material, which can be easily printed on an article to be bonded and which can restrain unsintered portions from being produced in a bonded portion in which the article is bonded to another article, and a bonding method using the same, if a monocarboxylic acid sintering aid having an ether bond is added to a bonding material of a silver paste containing: fine silver particles having an average primary particle diameter of 1 to 50 nanometers; silver particles having an average primary particle diameter of 0.5 to 4 micrometers; a solvent; and a dispersant. Thus, the inventors have made the present invention.

According to the present invention, there is provided a bonding material of a silver paste comprising: fine silver particles having an average primary particle diameter of 1 to 50 nanometers; silver particles having an average primary particle diameter of 0.5 to 4 micrometers; a solvent; a dispersant; and a monocarboxylic acid sintering aid having an ether bond, wherein the content of the fine silver particles is in the range of from 5% by weight to 30% by weight, and the content of the silver particles is in the range of from 60% by weight to 90% by weight, the total content of the fine silver particles and the silver particles being not less than 90% by weight.

In this bonding material, the monocarboxylic acid sintering aid having the ether bond is preferably butoxyethoxyacetic acid. The amount of the monocarboxylic acid sintering aid having the ether bond is preferably 0.2 to 1.5% by weight with respect to the silver paste. The dispersant is preferably a phosphate ester dispersant. The amount of the phosphate ester dispersant is preferably 0.01 to 0.2% by weight with respect to the silver paste. The dispersant may contain an acrylic resin dispersant. In this case, the amount of the acrylic resin dispersant is preferably 2% by weight or less with respect to the silver paste. The solvent preferably comprises a primary alcohol solvent and a terpene alcohol solvent. Each of the fine silver particles is preferably coated with an organic compound having a carbon number of not greater than 8, such as hexanoic acid. Each of the silver particles is preferably coated with an organic compound, such as oleic acid. The bonding material preferably has a viscosity of not greater than 100 Pa·s when the viscosity is measured at 25° C. and 6.4 rpm by means of a rheometer.

According to the present invention, there is provided a bonding method comprising the steps of: arranging the above-described bonding material between articles; and heating the bonding material to sinter silver therein to form a silver bonding layer to bond the articles to each other with the silver bonding layer.

Throughout the specification, the expression "the average primary particle diameter of fine silver particles" means an average value of primary particle diameters of fine silver particles based on a transmission electron microphotograph (TEM image), and the expression "the average primary particle diameter of silver particles" means the 50% particle diameter ($D_{50}$ diameter) of silver particles (the diameter of cumulative 50% by weight of silver particles) measured by the laser diffractometry.

According to the present invention, it is possible to provide a bonding material, which can be easily printed on an article to be bonded and which can restrain unsintered portions from being produced in a bonded portion in which the article is bonded to another article, and a bonding method using the same.

BEST MODE FOR CARRYING OUT THE INVENTION

In a preferred embodiment of a bonding material according to the present, the bonding material comprises a silver paste containing: fine silver particles having an average primary particle diameter of 1 to 50 nanometers; silver particles having an average primary particle diameter of 0.5 to 4 micrometers; a solvent; a dispersant; and a monocarboxylic acid sintering aid having an ether bond, wherein the content of the fine silver particles is in the range of from 5% by weight to 30% by weight, and the content of the silver particles is in the range of from 60% by weight to 90% by weight, the total content of the fine silver particles and the silver particles being not less than 90% by weight.

The average primary particle diameter of the fine silver particles (silver nanoparticles) is in the range of from 1 nanometer to 50 nanometers, preferably from 5 micrometers to 40 nanometers, and more preferably from 10 nanometers to 30 nanometers. Each of the fine silver particles is preferably coated with an organic compound having a carbon number of not greater than 8, such as hexanoic acid or sorbic acid, and more preferably coated with hexanoic acid.

The average primary particle diameter of the silver particles (silver micron-particles) is in the range of from 0.5 micrometers to 4 micrometers, preferably from 0.7 micrometers to 3.5 micrometers, and more preferably from 0.8 micrometers to 3 micrometers. Each of the silver particles is preferably coated with an organic compound, such as oleic acid or stearic acid, and more preferably coated with oleic acid.

The monocarboxylic acid sintering aid having the ether bond is preferably butoxyethoxyacetic acid. The amount of the monocarboxylic acid sintering aid having the ether bond is preferably 0.2 to 1.5% and more preferably 0.25 to 1.2% by weight, with respect to the silver paste.

The dispersant is preferably a phosphate ester dispersant, such as a dispersant containing phosphate ester. The amount of the phosphate ester dispersant is preferably 0.01 to 0.2% by weight and more preferably 0.1 to 0.15% by weight, with respect to the silver paste. The dispersant may contain an acrylic resin dispersant. In this case, the amount of the acrylic resin dispersant is preferably 2% by weight or less and more preferably 1.5% by weight or less, with respect to the silver paste.

The solvent preferably comprises a primary alcohol solvent and a terpene alcohol solvent. As the primary alcohol, there may be used 1-octanol, 1-decanol or the like. As the terpene alcohol solvent, there may be used a commercially-available terpene containing alcohol solvent (Terusolve TOE-100, Terusolve MTPH or the like, produced by Nippon Terpene Chemicals, Inc.). The amount of the solvent is preferably 3 to 8% by weight and more preferably 4 to 7% by weight, with respect to the silver paste.

The bonding material preferably has a viscosity of not greater than 100 Pa·s when the viscosity is measured at 25° C. and 6.4 rpm by means of a rheometer (viscoelasticity measuring apparatus).

In a preferred embodiment of a bonding method according to the present invention, the above-described bonding material is arranged between articles to be heated to sinter silver therein to form a silver bonding layer to bond the articles to each other with the silver bonding layer.

Specifically, the above-described bonding material is applied on at least one of two articles to be arranged between the articles to be heated at 60 to 200° C., preferably at 80 to 170° C., to be dried to form a predried film, and then, heated at 210 to 400° C., preferably at 230 to 300° C., to sinter silver in the silver paste to form a silver bonding layer to bond the articles with the silver bonding layer. Furthermore, when the bonding material is heated, pressure may be applied between the articles although it is not always required to apply pressure. It is possible to bond articles even if the bonding material is heated in the atmosphere, although it is possible to bond articles by heating the bonding material in an inert atmosphere, such as a nitrogen atmosphere.

Examples of a bonding material and a bonding method using the same according to the present invention will be described below in detail.

Example 1

First, there was prepared a bonding material of a silver paste containing: 19.785% by weight of fine silver particles coated with hexanoic acid and having an average primary particle diameter of 20 nanometers (DP-1 produced by DOWA ELECTRONICS MATERIALS CO., LTD.); 72.215% by weight of silver particles coated with oleic acid and having an average primary particle diameter of 0.8 micrometers (AG2-1C produced by DOWA HIGHTEC CO., LTD.); 1.0% by weight of butoxyethoxyacetic acid (BEA) (produced by Tokyo Chemical Industry Co., Ltd.) serving as a monocarboxylic acid sintering aid having an ether bond; 0.14% by weight of a phosphate ester dispersant (SOLPLUS D540 produced by Lubrizol Corporation); and 3.64% by weight of 1-decanol (alcohol) and 3.22% by weight of a terpene alcohol solvent (Terusolve MTPH produced by Nippon Terpene Chemicals, Inc.) serving as a solvent. Furthermore, the concentration of silver in this bonding material was 91.32% by weight.

The viscosity of this bonding material (silver paste) was obtained by a rheometer (viscoelasticity measuring apparatus) (HAAKE Rheostress 600 produced by Thermo Scientific, Inc., used cone: C35/2°). As a result, the viscosity measured at 25° C. was 211.8 (Pa·s) at 0.6 rpm (2.1 $s^{-1}$) and 18.09 (Pa·s) at 6.4 rpm (20.1 $s^{-1}$). When the viscosity was measured at 25° C., the ratio (thixotropic ratio) of the viscosity at 2 $s^{-1}$ to the viscosity at 20 $s^{-1}$ (viscosity at 2 $s^{-1}$/viscosity at 20 $s^{-1}$) was 11.7. The print quality (printability) of the bonding material (silver paste) was good.

Then, there were prepared a copper plate having a size of 10 mm×10 mm×1 mm treated with 10% sulfuric acid after being degreased with ethanol, and an Si chip having a size of 3 mm×3 mm×0.3 mm plated with silver.

Then, a metal mask having a thickness of 50 micrometers was arranged on the copper plate, and the above-described bonding material (silver paste) was applied on the copper plate so as to have a size of 3.5 mm×3.5 mm and a thickness of 50 micrometers.

Then, the Si chip was arranged on the bonding material applied on the copper plate, and a load of 0.1 MPa was applied for 10 seconds between the bonding material and the Si chip. Then, a lamp furnace was used in a nitrogen atmosphere to raise temperature at a temperature rising rate of 0.1° C./s from 25° C. to 150° C. to carry out a pre-backing treatment for holding temperature at 150° C. for 30 minutes to dry the silver paste, and then, to raise temperature at a temperature rising rate of 0.1° C./s to 250° C. to carry out a calcination treatment for holding temperature at 250° C. for 60 minutes to sinter silver in the silver paste to form a silver bonding layer to bond the Si chip to the copper plate with the silver bonding layer.

With respect to a bonded article thus obtained, the cross-section of the bonded portion (silver bonding layer) was observed at a magnification of 30,000 by means of a scanning electron microscope (SEM). As a result, any unsintered portions were not observed, so that the bonding of the Si chip to the copper plate was good.

Example 2

There was prepared a bonding material of the same silver paste as that in Example 1, except that the amount of butoxyethoxyacetic acid (BEA) was 0.5% by weight and the amount of 1-decanol (alcohol) was 4.14% by weight. Furthermore, the concentration of silver in this bonding material was 91.36% by weight.

The viscosity of this bonding material (silver paste) was obtained by the same method as that in Example 1. As a result, the viscosity measured at 25° C. was 203.2 (Pa·s) at 0.6 rpm (2.1 $s^{-1}$) and 15.55 (Pa·s) at 6.4 rpm (20.1 $s^{-1}$). When the viscosity was measured at 25° C., the ratio (thixotropic ratio) of the viscosity at 2 $s^{-1}$ to the viscosity at 20 $s^{-1}$ was 13.1. The print quality (printability) of the bonding material (silver paste) was good.

This bonding material (silver paste) was used for obtaining a bonded article by the same method as that in Example 1. With respect to this bonded article, the silver bonding layer was observed by the same method as that in Example 1. As a result, any unsintered portions were not observed, so that the bonding of the Si chip to the copper plate was good.

Example 3

There was prepared a bonding material of the same silver paste as that in Example 1, except that the amount of butoxyethoxyacetic acid (BEA) was 0.3% by weight and the amount of 1-decanol (alcohol) was 4.34% by weight. Furthermore, the concentration of silver in this bonding material was 91.36% by weight.

The viscosity of this bonding material (silver paste) was obtained by the same method as that in Example 1. As a result, the viscosity measured at 25° C. was 125.7 (Pa·s) at 0.6 rpm (2.1 $s^{-1}$) and 16.69 (Pa·s) at 6.4 rpm (20.1 $s^{-1}$). When the viscosity was measured at 25° C., the ratio (thixotropic ratio) of the viscosity at 2 $s^{-1}$ to the viscosity at 20 $s^{-1}$ was 7.5. The print quality (printability) of the bonding material (silver paste) was good.

This bonding material (silver paste) was used for obtaining a bonded article by the same method as that in Example 1. With respect to this bonded article, the silver bonding layer was observed by the same method as that in Example 1. As a result, any unsintered portions were not observed, so that the bonding of the Si chip to the copper plate was good.

Example 4

There was prepared a bonding material of the same silver paste as that in Example 1, except that 1.0% by weight of acrylic resin dispersant (V0340 produced by Kusumoto Chemicals, Ltd.) was added in addition to the phosphate ester dispersant and that the amount of 1-decanol (alcohol) was 2.64% by weight. Furthermore, the concentration of silver in this bonding material was 91.32% by weight.

The viscosity of this bonding material (silver paste) was obtained by the same method as that in Example 1. As a result, the viscosity measured at 25° C. was 497.5 (Pa·s) at 0.6 rpm (2.1 $s^{-1}$) and 39.46 (Pa·s) at 6.4 rpm (20.1 $s^{-1}$). When the viscosity was measured at 25° C., the ratio (thixotropic ratio) of the viscosity at 2 $s^{-1}$ to the viscosity at 20 $s^{-1}$ was 12.6. The print quality (printability) of the bonding material (silver paste) was good.

This bonding material (silver paste) was used for obtaining a bonded article by the same method as that in Example 1. With respect to this bonded article, the silver bonding layer was observed by the same method as that in Example 1. As a result, any unsintered portions were not observed, so that the bonding of the Si chip to the copper plate was good.

Comparative Example 1

There was prepared a bonding material of the same silver paste as that in Example 4, except that 0.067% by weight of diglycolic acid (DGA) (Midori Kagaku Co., Ltd.) being a dicarboxylic acid sintering aid having an ether bond was used in place of butoxyethoxyacetic acid (BEA) and that the amount of 1-decanol (alcohol) was 3.58% by weight. Furthermore, the concentration of silver in this bonding material was 91.33% by weight.

The viscosity of this bonding material (silver paste) was obtained by the same method as that in Example 1. As a result, the viscosity measured at 25° C., was 494.0 (Pa·s) at 0.6 rpm (2.1 $s^{-1}$) and 48.65 (Pa·s) at 6.4 rpm (20.1 $s^{-1}$). When the viscosity was measured at 25° C., the ratio (thixotropic ratio) of the viscosity at 2 $s^{-1}$ to the viscosity at 20 $s^{-1}$ was 10.2. The print quality (printability) of the bonding material (silver paste) was good.

This bonding material (silver paste) was used for obtaining a bonded article by the same method as that in Example 1. With respect to this bonded article, the silver bonding layer was observed by the same method as that in Example 1. As a result, unsintered portions were easily observed, so that the bonding of the Si chip to the copper plate was not good.

Comparative Example 2

There was prepared a bonding material of the same silver paste as that in Comparative Example 1, except that the amount of diglycolic acid (DGA) (dicarboxylic acid) was 0.201% by weight and the amount of 1-decanol (alcohol) was 3.44% by weight. Furthermore, the concentration of silver in this bonding material was 91.48% by weight.

The viscosity of this bonding material (silver paste) was obtained by the same method as that in Example 1. As a result, the viscosity was too high, so that it was not possible to measure the viscosity. Thus, the print quality (printability) of the bonding material (silver paste) was not good.

This bonding material (silver paste) was used for obtaining a bonded article by the same method as that in Example 1. With respect to this bonded article, the silver bonding layer was observed by the same method as that in Example 1. As a result, unsintered portions were slightly observed, so that the bonding of the Si chip to the copper plate was not good.

Comparative Example 3

There was prepared a bonding material of the same silver paste as that in Example 1, except that the amount of butoxyethoxyacetic acid (BEA) was 0.1% by weight and the amount of 1-decanol (alcohol) was 4.54% by weight. Furthermore, the concentration of silver in this bonding material was 89.46% by weight.

The viscosity of this bonding material (silver paste) was obtained by the same method as that in Example 1. As a result, the viscosity measured at 25° C., was 137.4 (Pa·s) at 0.6 rpm (2.1 s$^{-1}$) and 19.0 (Pa·s) at 6.4 rpm (20.1 s$^{-1}$). When the viscosity was measured at 25° C., the ratio (thixotropic ratio) of the viscosity at 2 s$^{-1}$ to the viscosity at 20 s$^{-1}$ was 7.2. The print quality (printability) of the bonding material (silver paste) was good.

This bonding material (silver paste) was used for obtaining a bonded article by the same method as that in Example 1. With respect to this bonded article, the silver bonding layer was observed by the same method as that in Example 1. As a result, unsintered portions were slightly observed, so that the bonding of the Si chip to the copper plate was not good.

The producing conditions and characteristics of the bonding materials produced in these examples and comparative examples are shown in Tables 1-2. In Table 2, "o" is shown if the viscosity, printability and sinterability of the bonding material are good, respectively, and "x" is shown if they are not good.

TABLE 1

| | Sintering Aid (wt %) | | Dispersant (wt %) | | Solvent (wt %) | | Concentration of Silver (wt %) |
|---|---|---|---|---|---|---|---|
| | BEA | DGA | Phosphate Ester | Acrylic Resin | Primary Alcohol | Terpene Alcohol | |
| Ex. 1 | 1.0 | — | 0.14 | — | 3.64 | 3.22 | 91.32 |
| Ex. 2 | 0.5 | — | 0.14 | — | 4.14 | 3.22 | 91.36 |
| Ex. 3 | 0.3 | — | 0.14 | — | 4.34 | 3.22 | 91.36 |
| Ex. 4 | 1.0 | — | 0.14 | 1.0 | 2.64 | 3.22 | 91.32 |
| Comp. 1 | — | 0.067 | 0.14 | 1.0 | 3.58 | 3.22 | 91.33 |
| Comp. 2 | — | 0.201 | 0.14 | 1.0 | 3.44 | 3.22 | 91.48 |
| Comp. 3 | 0.1 | — | 0.14 | — | 4.54 | 3.22 | 89.46 |

TABLE 2

| | Viscosity (Pa·s) | | Thixotropic Ratio | Printability | Sinterability |
|---|---|---|---|---|---|
| | 0.6 rpm | 6.4 rpm | | | |
| Ex. 1 | 211.8 | 18.09 | 11.7 | o | o |
| Ex. 2 | 203.2 | 15.55 | 13.1 | o | o |
| Ex. 3 | 125.7 | 16.69 | 7.5 | o | o |
| Ex. 4 | 497.5 | 39.46 | 12.6 | o | o |
| Comp. 1 | 494.0 | 48.65 | 10.2 | o | x |
| Comp. 2 | — | — | — | x | x |
| Comp. 3 | 137.4 | 19.00 | 7.2 | o | x |

The invention claimed is:

1. A bonding material of a silver paste consisting of:
fine silver particles having an average primary particle diameter of 1 to 50 nanometers, each of the fine silver particles being coated with an organic compound;
silver particles having an average primary particle diameter of 0.5 to 4 micrometers, each of the silver particles being coated with an organic compound;
a solvent consisting of a primary alcohol solvent and a terpene alcohol solvent;
a dispersant containing a phosphate ester dispersant; and
a monocarboxylic acid sintering aid having an ether bond,
wherein the content of the fine silver particles is in the range of from 5% by weight to 30% by weight, and the content of the silver particles is in the range of from 60% by weight to 90% by weight, the total content of the fine silver particles and the silver particles being not less than 90% by weight.

2. A bonding material as set forth in claim 1, wherein said monocarboxylic acid sintering aid having the ether bond is butoxyethoxyacetic acid.

3. A bonding material as set forth in claim 1, wherein the amount of said monocarboxylic acid sintering aid having the ether bond is 0.2 to 1.5% by weight with respect to said silver paste.

4. A bonding material as set forth in claim 1, wherein the amount of said phosphate ester dispersant is 0.01 to 0.2% by weight with respect to said silver paste.

5. A bonding material as set forth in claim 1, which further comprises an acrylic resin dispersant.

6. A bonding material as set forth in claim 5, wherein the amount of said acrylic resin dispersant is 2% by weight or less with respect to said silver paste.

7. A bonding material as set forth in claim 1, wherein each of said fine silver particles is coated with an organic compound having a carbon number of not greater than 8.

8. A bonding material as set forth in claim 7, wherein said organic compound coating the fine silver particles is hexanoic acid.

9. A bonding material as set forth in claim 1, wherein each of said silver particles is coated with an organic compound.

10. A bonding material as set forth in claim 9, wherein said organic compound coating the silver particles is oleic acid.

11. A bonding material as set forth in claim 1, which has a viscosity of not greater than 100 Pa·s when the viscosity is measured at 25° C. and 6.4 rpm by means of a rheometer.

12. A bonding method comprising the steps of:
arranging a bonding material, as set forth in claim 1, between articles; and
heating the bonding material to sinter silver therein to form a silver bonding layer to bond said articles to each other with the silver bonding layer.

13. A bonding material of a silver paste consisting of:
fine silver particles having an average primary particle diameter of 1 to 50 nanometers, each of the fine silver particles being coated with an organic compound, the content of the fine silver particles being in the range of from 5% by weight to 30% by weight;
silver particles having an average primary particle diameter of 0.5 to 4 micrometers, each of the silver particles being coated with an organic compound, the content of the silver particles being in the range of from 60% by weight to 90% by weight, the total content of the fine silver particles and the silver particles being not less than 90% by weight;
a solvent consisting of a primary alcohol solvent and a terpene alcohol solvent, the amount of the solvent being 3 to 8% by weight with respect to the silver paste;
a phosphate ester dispersant, the amount of the phosphate ester dispersant being 0.01 to 0.2% by weight with respect to the silver paste; and a monocarboxylic acid sintering aid having an ether bond, the amount of the monocarboxylic acid sintering aid being 0.2 to 1.5% by weight with respect to the silver paste.

* * * * *